(12) United States Patent
Sugiyama et al.

(10) Patent No.: US 7,354,801 B2
(45) Date of Patent: Apr. 8, 2008

(54) METHOD FOR MANUFACTURING SEMICONDUCTOR DEVICE

(75) Inventors: Eiji Sugiyama, Kanagawa (JP); Kyosuke Ito, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 182 days.

(21) Appl. No.: 11/229,497

(22) Filed: Sep. 20, 2005

(65) Prior Publication Data
US 2006/0063309 A1    Mar. 23, 2006

(30) Foreign Application Priority Data
Sep. 21, 2004 (JP) .............. 2004-273426

(51) Int. Cl.
*H01L 21/44* (2006.01)
(52) U.S. Cl. .............. 438/113; 438/68; 438/460
(58) Field of Classification Search .......... 438/113, 438/114, 68, 455, 458, 459, 460, 462, 463, 438/464, 465
See application file for complete search history.

(56) References Cited

U.S. PATENT DOCUMENTS

| 5,757,456 A | 5/1998 | Yamazaki et al. |
| 5,821,138 A | 10/1998 | Yamazaki et al. |
| 6,118,502 A | 9/2000 | Yamazaki et al. |
| 6,376,333 B1 | 4/2002 | Yamazaki et al. |
| 2003/0071953 A1* | 4/2003 | Yamazaki et al. .......... 349/149 |
| 2003/0157783 A1* | 8/2003 | Fonash et al. .............. 438/458 |
| 2003/0170946 A1* | 9/2003 | Kondo ....................... 438/200 |
| 2004/0147092 A1* | 7/2004 | Liao et al. ................... 438/438 |
| 2005/0020037 A1* | 1/2005 | Asami et al. ............... 438/485 |
| 2005/0070038 A1 | 3/2005 | Yamazaki et al. |
| 2005/0112805 A1* | 5/2005 | Goto et al. ................. 438/149 |

FOREIGN PATENT DOCUMENTS

| JP | 08-250745 | 9/1996 |
| JP | 08-288522 | 11/1996 |

* cited by examiner

*Primary Examiner*—Kevin M. Picardat
(74) *Attorney, Agent, or Firm*—Fish & Richardson, P.C.

(57) ABSTRACT

In the case where an integrated circuit formed of a thin film is formed over a substrate and peeled from the substrate, a fissure (also referred to as crack) is generated in the integrated circuit in some cases. The present invention is to restrain the generation of a fissure by fixing the proceeding direction of etching in one direction to make a peeled layer warp in one direction in accordance with the proceeding of etching. For example, the proceeding of etching can be controlled by utilizing the fact that a portion where a substrate is in contact with a base insulating layer is not etched in the case of patterning a peeling layer provided over the substrate, then forming the base insulating layer, and then fixing a peeled layer by the portion where the substrate is in contact with the base insulating layer.

23 Claims, 11 Drawing Sheets

416   413   411a

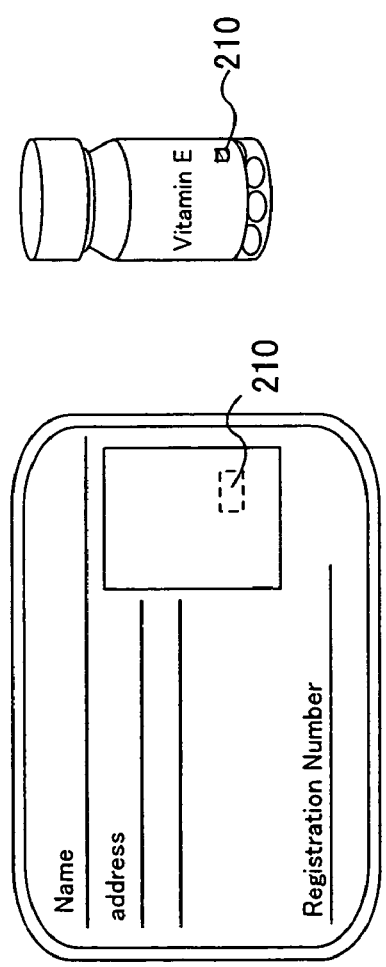
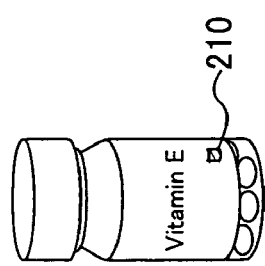
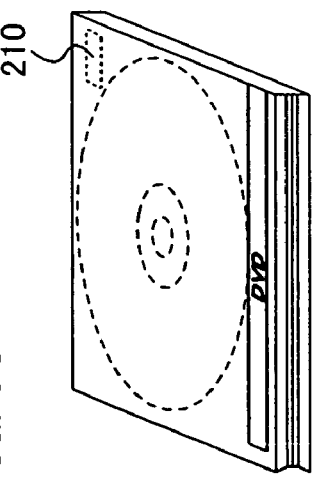
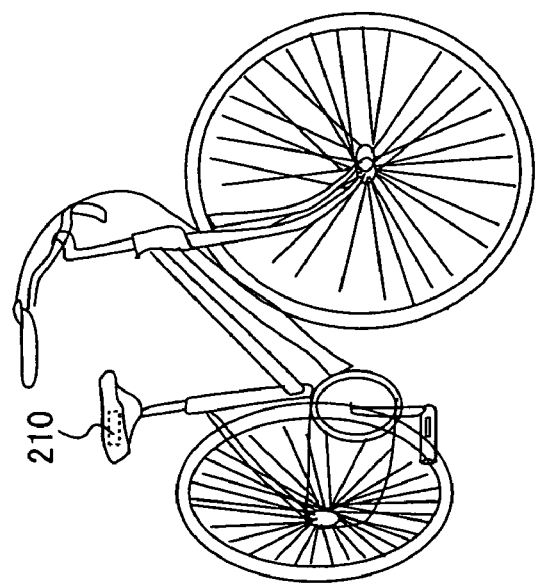
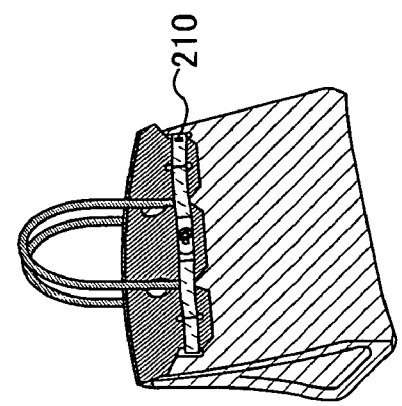
FIG. 9A
FIG. 9B
FIG. 9C
FIG. 9D
FIG. 9E

METHOD FOR MANUFACTURING SEMICONDUCTOR DEVICE

BACKGROUND OF THE INVENTION

1. Field of the Invention

The present invention relates to a semiconductor device comprising a circuit including a thin film transistor (hereinafter, referred to as TFT) and a method for manufacturing the semiconductor device. For example, the invention relates to an electronic device on which an electro-optical device as typified by a liquid crystal display panel or a light emitting display device having an organic light emitting element is mounted as a component.

Further, in this specification, the term "semiconductor device" denotes a device in general which can operate by utilizing a semiconductor characteristic. An electro-optical device, a semiconductor circuit, and an electronic device are all included in the semiconductor device.

2. Description of the Related Art

In recent years, technique of forming a thin film transistor (TFT) using a semiconductor thin film (having a thickness of approximately from several to several hundreds nanometers) which is formed over a substrate having an insulating surface has attracted attention. A thin film transistor is broadly applied to electronic devices such as ICs or electro-optical devices, and has been rushed to be developed especially as a switching element of an image display device.

Various applications using such an image display device have been expected, and in particular, application to a portable device attracts attention. A glass substrate or a quartz substrate is widely used now; however, these substrates have some drawbacks such as being fragile and heavy. Further, these substrates are unsuitable for mass-production since it is difficult to use a large-sized glass substrate or a large-sized quartz substrate. Therefore, it has been attempted that a TFT element is formed over a substrate having flexibility as typified by a flexible plastic film.

However, the maximum temperature of the process should be lowered since the heat resistance of a plastic film is low. As a result, it has been impossible to form a TFT having characteristics as favorable as that formed over a glass substrate. Thus, a high-performance liquid crystal display device or a light emitting element using a plastic film has not been realized yet.

Consequently, technique of peeling an element formed over a glass substrate from the substrate and transferring the element to another base material such as a plastic film is proposed.

The applicant proposes peeling or transferring technique disclosed in the following patent document 1 (Patent document 1: Japanese Patent Laid-Open No. H8-288522) or patent document 2 (Patent document 2: Japanese Patent Laid-Open No. H8-250745).

In the case of a very small device such as an IC, a semiconductor wafer is pasted onto an adhesive sheet to be divided as a chip unit, then the divided semiconductor element is picked up from the adhesive sheet, and then the picked up semiconductor element is installed to be mounted in a circuit substrate included in an IC card or the like. Since the semiconductor wafer is used, the semiconductor element has some drawbacks such as being damaged or fragile when being picked up.

It has been recently considered the possibility of utilizing "non contact IC tag" (generally, referred to as non contact data carrier) that can record and read out information out of touch for information management of goods or products, physical distribution management, and the like.

A semiconductor wafer serving as a mother body of a semiconductor chip used for an IC card or a non contact IC tag is expensive and unfit for mass-production.

A the matrix type (multiple patterned type) manufacturing method in which multiple electronic component elements are mounted over a glass substrate and divided into individual pieces to be a product has been distributed. Plural small device are preferably manufactured over a large substrate in consideration for mass-production.

In the case where an integrated circuit including a thin film is formed over a substrate and peeled from the substrate, a fissure (also referred to as crack) may be generated in the integrated circuit in some cases.

SUMMARY OF THE INVENTION

It is an object of the present invention to provide a method for manufacturing efficiently and massively very small devices which can receive or transmit data in touch, preferably, out of touch by forming a thin film integrated circuit over a large glass substrate and peeling the integrated circuit from the substrate. Especially, the thin film integrated circuit is difficult to use since there is a threat that the integrated circuit is flied when being transported since the integrated circuit is extremely thin.

FIG. 11A is a photograph showing an integrated circuit having a crack. In a case of forming a peeling layer over a substrate, forming a peeled layer including a semiconductor element formed over the peeling layer, and etching only the peeling layer from the periphery the integrated circuit, namely four directions, crack is generated in the integrated circuit. FIG. 11B shows the position of the crack. The inventors think that the generation of the crack is related to the proceeding of the etching judging from the position of the crack. The inventors think that the peeling layer is etched from four directions and the peeled layer is warped, accordingly, the crack is generated in a region where the etchings proceeding to the directions overlap with each other. The peeled layer is warped from a portion where the peeling layer is removed due to stress of each film included in the peeled layer. Therefore, the inventors think that the crack is generated in a boundary of the peeled layer warped in different directions since etching proceeds with the peeled layer warped in four directions when the peeling layer is removed from four directions.

In addition, the crack described above is not generated in the case as follows: a peeling layer is provided over a substrate, a peeled layer including a semiconductor element is provided over the peeling layer, the peeled layer is fixed to another substrate, and the peeling layer is removed by etching. This is thought to be attributed to the fact that the peeled layer is restrained from warping by fixing the peeled layer to another substrate. However, the number of steps increases when another substrate is used, and transferring step is required one more time. Especially, the integrated circuit including a thin film is difficult to use since the integrated circuit is extremely thin.

Consequently, the inventors find that the generation of a fissure in an integrated circuit can be prevented when the proceeding of etching is controlled in the case of providing a peeling layer over a substrate, providing a peeled layer including an integrated circuit over the peeling layer, and removing the peeling layer by etching.

The invention is to restrain the generation of a fissure by controlling the proceeding direction of etching in one direction to make a peeled layer warp in one direction in accordance with the proceeding of etching. For example, the proceeding of etching can be controlled by utilizing the fact that a portion where a substrate is in contact with a base insulating layer is not etched in the case of patterning a peeling layer provided over the substrate, then forming the base insulating layer over the peeling layer and the substrate. As another method for fixing a peeled layer, a method in which the proceeding of etching is controlled by setting the position of an integrated circuit and the position of the exposed portion of a peeling layer to make a part of the peeling layer remain purposely in a portion which is not overlapped with the integrated circuit may be used.

In addition, etching may be made to proceed from two opposing directions, and the invention is to restrain the generation of a fissure by fixing the proceeding direction of etching in two opposing directions to make a peeled layer warp in two directions in accordance with the proceeding of etching.

One embodiment of the invention disclosed in this specification provides a method for manufacturing a semiconductor device comprises: forming a peeling layer over a first substrate; forming a base insulating layer over the peeling layer and the first substrate; forming at least one thin film integrated circuit over the peeling layer with the base insulating layer interposed therebetween; forming a protective layer covering the thin film integrated circuit; exposing an edge of the peeling layer by removing the base insulating layer selectively; etching the peeling layer; and transferring the thin film integrated circuit to a second substrate, the etching is proceeded in one direction from the exposed edge of peeling layer, and an adhesive material is provided on the second substrate.

One embodiment of the invention disclosed in this specification provides a method for manufacturing a semiconductor device comprises: forming a peeling layer over a first substrate; forming a base insulating layer over the peeling layer and the first substrate; forming at least one thin film integrated circuit over the peeling layer with the base insulating layer interposed therebetween; forming a protective layer covering the thin film integrated circuit; exposing first and second edges of the peeling layer by removing the base insulating layer selectively; etching the peeling layers; and transferring the thin film integrated circuit to a second substrate, the first and second edges of the peeling layer are opposed to each other, the etching is proceeded in one direction from the exposed first and second edges of peeling layer, and an adhesive material is provided on the second substrate.

One embodiment of the invention disclosed in this specification provides a method for manufacturing a semiconductor device comprises: forming a peeling layer over a first substrate; forming at least first and second peeling layers by removing the peeling layer selectively; forming a base insulating layer over the first and second peeling layers and the first substrate; forming a first thin film integrated circuit over the first peeling layer with the base insulating layer interposed therebetween and a second thin film integrated circuit over the second peeling layer with the base insulating layer interposed therebetween; forming a first protective layer covering the first thin film integrated circuit and a second protective layer covering the second thin film integrated circuit; exposing an edge of the first peeling layer and an edge of the second peeling layer by removing the base insulating layer selectively; etching the first and second peeling layers; and transferring the first and second thin film integrated circuits to a second substrate, the edge of the second peeling layer is exposed between the first and second thin film integrated circuits, the etching is proceeded in one direction from the exposed edge of the first peeling layer and the exposed edge of the second peeling layer, and an adhesive material is provided on the second substrate.

One embodiment of the invention disclosed in this specification provides a method for manufacturing a semiconductor device comprises: forming a peeling layer over a first substrate; forming at least first and second peeling layers by removing the peeling layer selectively; forming a base insulating layer over the first and second peeling layers and the first substrate; forming a first thin film integrated circuit over the first peeling layer with the base insulating layer interposed therebetween and a second thin film integrated circuit over the second peeling layer with the base insulating layer interposed therebetween; forming a first protective layer covering the first thin film integrated circuit and a second protective layer covering the second thin film integrated circuit; exposing an edge of the first peeling layer and an edge of the second peeling layer by removing the base insulating layer selectively; etching the first and second peeling layers; and interposing the first and second thin film integrated circuits between a first film and a second film by thermocompressing, the edge of the second peeling layer is exposed between the first thin film integrated circuit and the second thin film integrated circuit, the etching is proceeded in one direction from the exposed edge of the first peeling layer and the exposed edge of the second peeling layer, and an adhesive material is provided on the second substrate.

One embodiment of the invention disclosed in this specification provides a method for manufacturing a semiconductor device comprises: forming a peeling layer over a first substrate; forming a base insulating layer over the peeling layer; forming at least first and second thin film integrated circuits over the peeling layer; forming a protective layer for covering the first and second thin film integrated circuits; exposing first and second edges of the peeling layer by selectively removing the base insulating layer; partially etching the peeling layer, thereby making a part of the peeling layer remained between the first and second thin film integrated circuits; and transferring first and second thin film integrated circuits to a second substrate, an adhesive material is provided on the second substrate.

In the foregoing each embodiments, the method further comprises dividing the first and second thin film integrated circuits into the individual pieces after the transferring step.

In the foregoing each embodiments, the method further comprises the method further comprises dividing the first and second thin film integrated circuits into the individual pieces after the interposing step.

In the foregoing each embodiments, other edges of the peeling layer except for the exposed edge of the peeling layer are covered by the base insulating film.

In the foregoing each embodiments, a top surface of the thin film integrated circuit is a rectangular shape and the exposed edge of peeling layer is located in parallel to one side or two opposing sides of the thin film integrated circuit.

In the foregoing each embodiments, the base insulating layer comprises a material which does not react chemically with gas or liquid containing fluorine halide. That is, the base insulating layer serves to protect a thin film integrated circuit from etching by gas or liquid containing fluorine halide. For example, an inorganic insulating film or the like using silicon nitride or silicon oxide as a main component can be used as the material of the base insulating layer.

In the foregoing each embodiment, the protective layer comprises an organic resin which does not react chemically with gas or liquid containing fluorine halide. That is, the protective layer serves to protect a thin film integrated circuit from etching by gas or liquid containing fluorine halide. For example, an epoxy resin, Teflon (registered trademark) resin, or the like can be used as the material of the protective layer.

In this specification, the term "peeling layer" denotes a layer which is removed by etching with gas or liquid containing fluorine halide, and the term "peeled layer" denotes a layer including a thin film integrated circuit which is to be peeled from a substrate. A stacked layer including at least a thin film integrated circuit and further including a base insulating layer or a protective layer can be also referred to as the peeled layer.

In this specification, the term "laminate film" denotes a stacked film including a base film and an adhesive synthetic resin film or a stacked film including two or more kinds of layers. As the base film, polyester such as PET or PBT, polyamide such as nylon 6 or nylon 66, an inorganic deposited film, or papers may be used. As an adhesive synthetic resin film, polyolefin such as PE or PP, acrylic-based synthetic resin, epoxy-based synthetic resin, or the like may be used. A laminate film is laminated by thermocompressing to an object using a laminating device. As pretreatment for a laminate step, an anchor coat agent is preferably coated, which can strengthen the adhesiveness between the laminate film and an object. Isocyanate-based material or the like may be used as the anchor coat agent.

In this specification, the term "heat sealing" denotes sealing by thermocompression. More specifically, an adhesion agent layer which is partially coated to the base film, or the outermost coat layer or the innermost coat layer having a low melting point of the laminate film is melted by applying heat and bonded by applying pressure.

The invention can be applied regardless of the TFT structure, and for example, a top gate TFT, a bottom gate TFT (reversely staggered TFT), or a staggered TFT can be used. Not only a single gate TFT but also a multi gate TFT having a plurality of channel formation regions such as a double gate TFT may be used.

As the active layer of the TFT, an amorphous semiconductor film, a semiconductor film including a crystalline structure, a compound semiconductor film including an amorphous structure, or the like can be appropriately used. Further, a semi-amorphous semiconductor film (also referred to as microcrystalline semiconductor film) having an intermediate structure of an amorphous structure and a crystalline structure (including a single crystal and a poly crystal), the third state that is free-energetically stable, and a crystalline region including a short-range order and a lattice distortion can be used.

According to the invention, damage such as a fissure to a semiconductor integrated circuit can be reduced.

In accordance with the invention, in the case where the thin film integrated circuits are held over the substrate, the substrate can be directly transported; therefore, the invention can be used for a mass-production equipment including a transporting means. For example, when the substrate held with the thin film integrated circuits is transported to a laminate device, laminate treatment of the thin film integrated circuits can be continuously carried out.

After peeling a thin film integrated circuit formed over the substrate from the substrate, the substrate can be reused.

These and other objects, features and advantages of the present invention will become more apparent upon reading of the following detailed description along with the accompanied drawings.

BRIEF DESCRIPTION OF THE DRAWINGS

FIGS. 9A to 9E are explanatory views of a usage pattern of a thin film integrated circuit;

DETAILED DESCRIPTION OF THE INVENTION

Figure 1A:
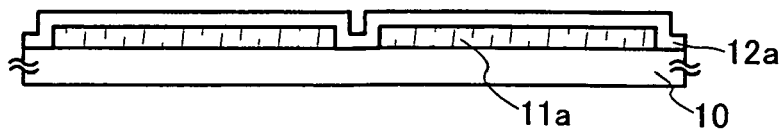
FIGS. 1A to 1G are explanatory cross-sectional views and top views of a method for manufacturing a thin film integrated circuit according to the present invention.

Embodiment mode according to the present invention is explained hereinafter.

According to the invention, a glass substrate is continuously used as a fixed substrate, which can prevent small sized integrated circuits from being scattered in a peeling step or a transferring step. Three methods described hereinafter can be given as this method.

A first method is a method for fixing an integrated circuit utilizing that a portion where a substrate is in contact with a base insulating layer is not etched by patterning a peeling layer provided over the substrate, then forming the base insulating layer over the peeling layer and the substrate, and then fixing the substrate and the base insulating film at the portion where the substrate is in contact with the base insulating layer.

A second method is a method for fixing by a remaining peeling layer utilizing that a portion of a peeling layer overlapping with a device covered with a protective layer is difficult to be removed when a device such as a semiconductor element is formed over the peeling layer and the device is covered with the protective layer (typically, resin).

A third method is a fixing method in which the proceeding of etching is controlled by setting the position of an integrated circuit and the position of an exposed portion of a peeling layer to make a part of the peeling layer remain purposely in a portion which is not overlapped with the integrated circuit and a peeled layer including the integrated circuit is fixed.

According to these fixing methods, a glass substrate is continuously used as a fixed substrate, which can prevent small sized integrated circuits from being scattered in a peeling step or a transferring step. According to the invention, plural of small devices can be manufactured over a large substrate, and the devices can be easily handled as individuals.

Embodiment modes according to the invention, one method among the above three method is explained in detail with reference to the drawings. However, the invention is not limited to the explanation hereinafter, and it is easily understood by those who are skilled in the art that embodiments and details herein disclosed can be modified in various ways without departing from the purpose and the scope of the invention. Therefore, it should be noted that the description of embodiment modes to be given below should not be interpreted as limiting the invention. Through the drawings of the embodiments, like components are denoted by like numerals as of these embodiments with each other.

Embodiment Mode 1

Here, a method for manufacturing a semiconductor device according to the present invention is explained hereinafter.

First, a peeling layer 11a is formed over a substrate 10 having an insulating surface, patterning of the peeling layer is performed. The substrate 10 having the insulating surface corresponds to a glass substrate, a quartz substrate, a plastic substrate, a resin substrate formed from a flexible synthetic resin such as acrylic, or a metal substrate. As for the peeling layer 11a, a layer containing silicon is formed by a known method such as a sputtering method or a plasma CVD method. The layer containing silicon corresponds to an amorphous semiconductor layer, a semi-amorphous semiconductor layer in which an amorphous state and a crystalline state are mixed, or a crystalline semiconductor layer.

Then, a base insulating layer 12a including an inorganic insulating film is formed. As for the base insulating layer 12a, a single layer film including silicon oxide, silicon nitride, silicon oxynitride, or silicon nitride oxide, or a stacked film thereof is formed by a known method such as a sputtering method or a plasma CVD method (refer to FIG. 1A).

Figure 1B:
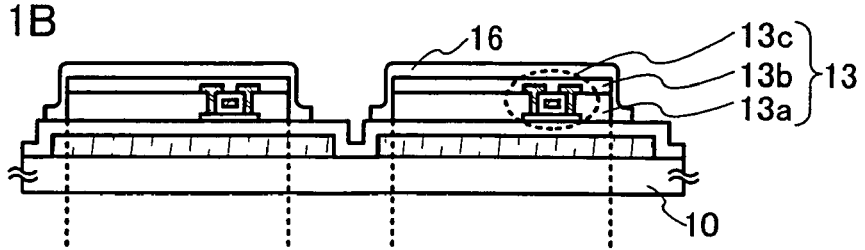

A peeled layer 13 including a first element group and the base insulating layer 12a as the first layer is formed. Then, a protective layer 16 is formed by a screen printing method or a droplet discharge method (refer to FIG. 1B). Although FIG. 1B illustrates an example showing the peeled layer including the first element group and a peeled layer including a second element group which is adjacent to the peeled layer including the first element group, the invention is not limited thereto in particular. The substrate 10 is provided with a number of element groups, which are divided lastly into individual products. The peeled layer 13 including the first element group includes a first interlayer insulating layer 13a, a second interlayer insulating layer 13b, a plurality of TFTs 13c, and a conductive layer serving as an antenna. The peeled layer 13 including the first element group ends up being one device.

Figure 1C:
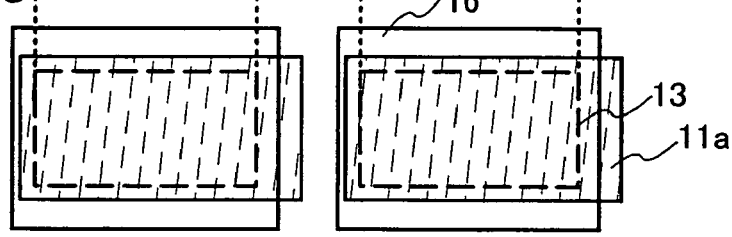

FIG. 1C shows a top view at this stage. The protective layer 16 may be formed so as to cover the peeled layer 13 including the first element group, and for example, the protective layer 16 is formed in a rectangular shape so as to cover one element group as one example of a top view is shown in FIG. 1C. The protective layer 16 is preferably includes a material which does not react chemically with gas or liquid containing fluorine halide. Here, the protective layer 16 is formed in a lattice shape using an epoxy resin by a screen printing method.

Figure 1D:
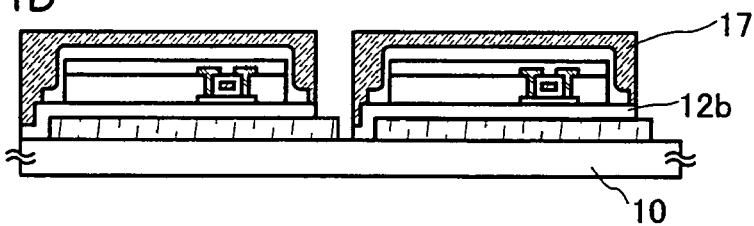

Then, a resist mask 17 is formed and the base insulating layer 12a is partially etched to make the base insulating layer 12b remain and to expose the peeling layer 11a (refer to FIG. 1D). The base insulating layer may be etched using the protective layer as a mask in a self-aligning manner to shorten the step.

Figure 1E:
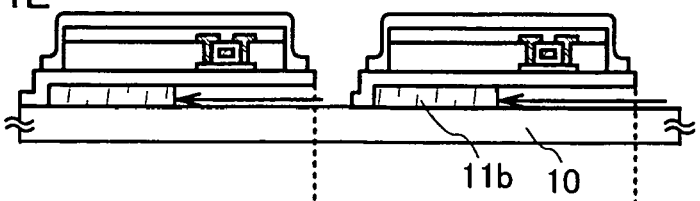
Figure 1F:
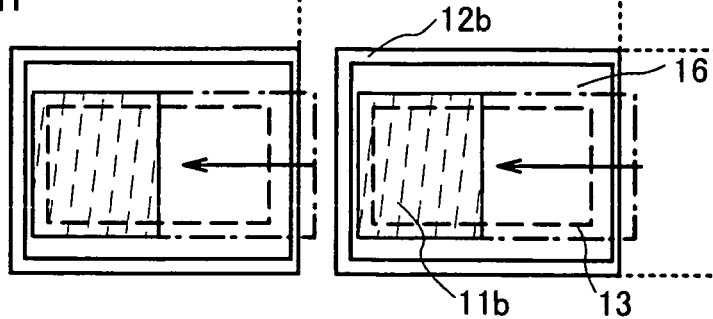
Figure 1G:
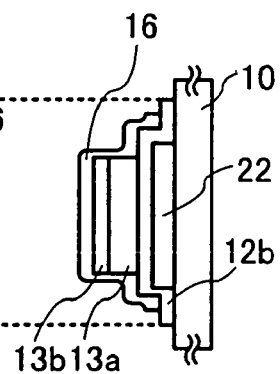

The peeling layer is removed using an etching agent. FIG. 1E shows a cross-sectional view in etching. As illustrated in FIG. 1E, the peeling layer is etched in one direction from the exposed portion thereof. FIG. 1F shows a top view at this stage. FIG. 1G shows a cross-sectional view taken in a different section from FIG. 1E. Gas or liquid containing fluorine halide is used for the etching agent. As the gas containing fluorine halide, for example, chlorine trifluoride ($ClF_3$) is used. When the etching is completed, the remaining peeling layer 11b is completely removed to form a space 22.

Figure 2A:
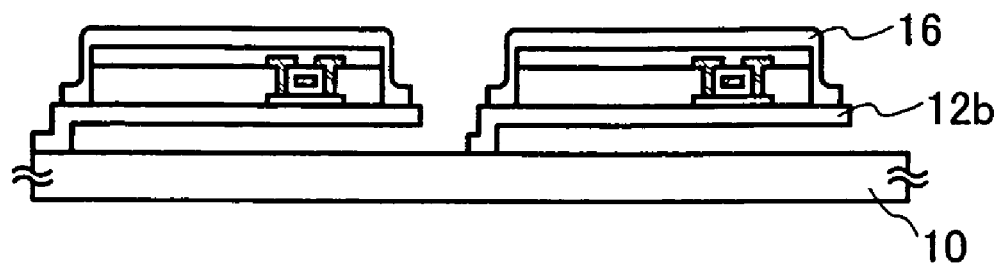
FIGS. 2A to 2C are explanatory cross-sectional views of a method for manufacturing a thin film integrated circuit according to the invention.

FIG. 2A shows a cross-sectional view after completing the etching. The peeled layer 13 including the first element group and the protective layer 16 are fixed by a contact portion between the base insulating layer 12b and the substrate 10 having the insulating surface. In other words, three sides of the peeled layer are fixed by the base insulating layer 12b after the etching. The peeled layer 13 including the first element group is restrained from warping and the generation of a crack can be prevented by fixing the peeled layer 13 using the base insulating layer 12b even though the etching of the peeling layer proceeds.

Figure 2B:
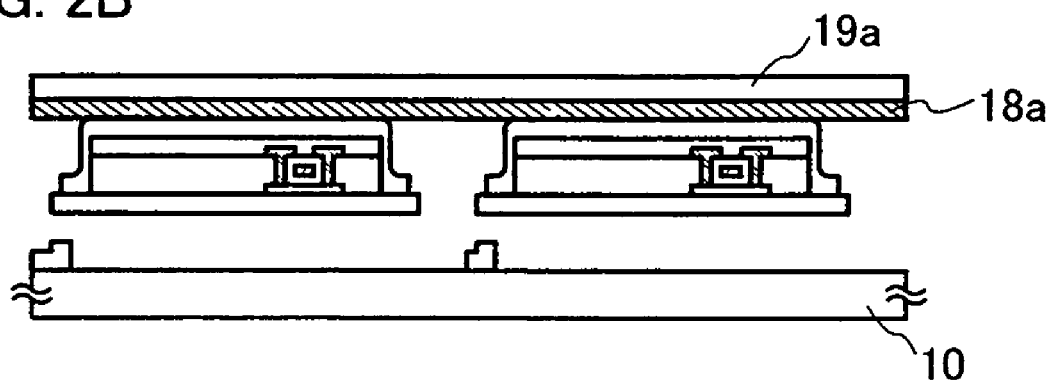

The peeled layer including the first element group and the peeled layer including the second element group are thermocompressed to a laminate film formed of a stacked layer of a first adhesive synthetic resin film 18a and a first base material film 19a by a lamination method to peel the peeled layer including the first element group and the peeled layer including the second element group from the substrate 10 having the insulating surface (FIG. 2B). FIG. 2B illustrates the following example: the base insulating layer is divided into two parts during a peeling step, and thus, a portion being overlapped with the peeled layer is peeled from the substrate 10 having an insulating surface, whereas a portion being in contact with the substrate remains on the substrate. It is to be noted that the base insulating layer and the substrate may be separated at the interface thereof without dividing the base insulating layer.

A laminate film having a total thickness of 15 µm to 200 µm is used in terms of strength, processing workability, costs, and the like. Here, a laminate film (with a total thickness of 60 µm) formed by a stacked layer of polyethylene (20 µm) and a polyethylene film (40 µm) is used.

In thermocompression, heating temperature and pressure are preferably set so that an element included in the element group is not destroyed, more preferably, element characteristics are not varied. Further, there is an effect that the protective layer 16 can concentrate pressure to prevent the pressure on the element group from concentrating during thermocompression.

Instead of the laminate film including the first adhesive synthetic resin film and the first base material film, a base material including an adhesion layer may be used.

At this step, as illustrated in FIG. 2B, the state that the peeled layer including the first element group and the peeled layer including the second element group adhere to the laminate film including the first adhesive synthetic resin film 18a and the first base material film 19a can be obtained.

Sealing is carried out by thermocompressing (at approximately 100° C.) the peeled layer including the first element group and the peeled layer including the second element group to a laminate film including a second adhesive synthetic resin film 20 and a second base material film 21 by a lamination method. Here, a laminate film (with a total thickness of 60 µm) including a polyethylene film (20 µm) and a polyethylene film (40 µm) is also used. This embodiment mode illustrates an example of sealing using two laminate films of one kind. However, the invention is not limited thereto, and two laminate films of different kinds may be used for the sealing.

Instead of the laminate film including the second adhesive synthetic resin film 20 and the second base material film 21, a base material including an adhesion layer can be used.

Figure 2C:
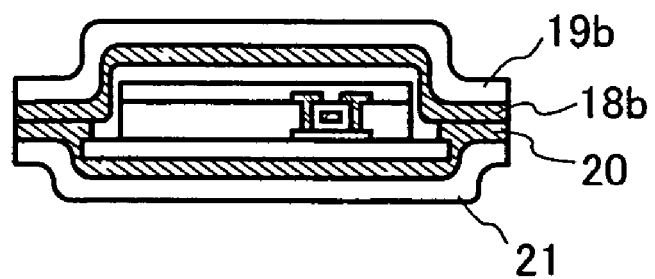

Lastly, the thermocompressed layers are divided into the individual pieces as illustrated in FIG. 2C. The laminate film is directly in contact with the first element group. Another material layer is not interposed between the laminate film and the first element group. Consequently, a semiconductor device having an extremely thin thickness (with a total thickness given by the thickness of the first element group (3 µm or less)+120 µm) sandwiched between two laminate films (60 µm) can be provided. Although FIG. 2C illustrates that the laminate film is bended, the two laminate films pasted with each other are almost plane practically since the laminated film has a thickness of 60 µm, whereas the first element group has a thickness of 3 µm or less.

Embodiment Mode 2

Here, a manufacturing method which is different from that of Embodiment Mode 1 is explained with reference to FIGS. 3A to 3F.

First, an island-shaped peeling layer 311a is formed over a substrate 310 having an insulating surface in the similar way as in Embodiment Mode 1. Then, a base insulating layer 312a including an inorganic insulating film is formed in the similar way as in Embodiment Mode 1 (refer to FIG. 3A).

Then, a peeled layer 313 including a first element group and the base insulating layer 312a as the first layer is formed in the similar way as in Embodiment Mode 1. The peeled layer 313 including the first element group includes a first interlayer insulating layer 313a, a second interlayer insulating layer 313b, a plurality of TFTs 313c, and a conductive layer serving as an antenna. The peeled layer 313 including the first element group ends up being one device. Then, a protective layer 316 is formed by a screen printing method or a droplet discharge method. Here, the edge portion of the protective layer 316 is set to be closer to the peeled layer 313 than the edge portion of the peeling layer 311a (refer to FIG. 3B).

Embodiment Mode 1 illustrates an example in which only one side of the peeling layer is exposed; however, this embodiment mode illustrates an example in which two opposing sides of the peeling layer are exposed.

Figure 3A:
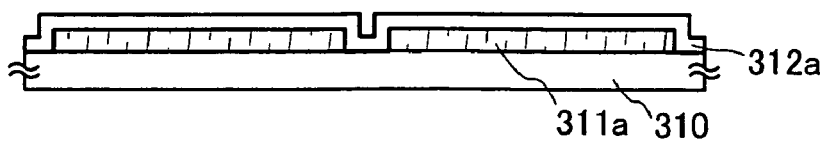
FIGS. 3A to 3F are explanatory cross-sectional views and top views of a method for manufacturing a thin film integrated circuit according to the invention.
Figure 3B:
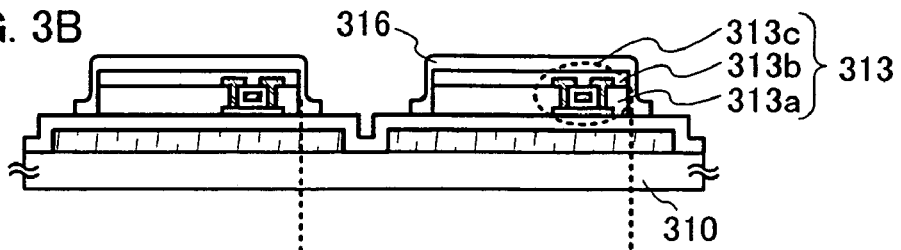
Figure 3C:
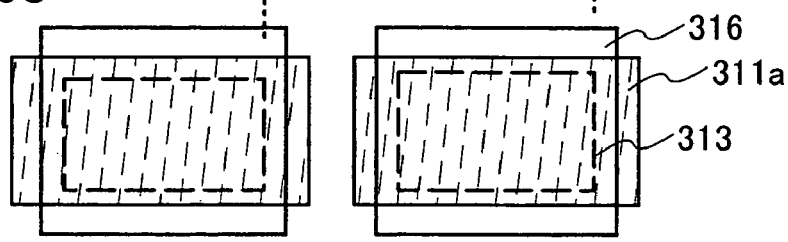

FIG. 3C shows a top view at this step. The protective layer 316 may be formed so as to cover the two opposing sides of the peeled layer 313 including the first element group. For example, the protective layer 316 is formed in a rectangular shape which intersects with one element group as one example of a top view is shown in FIG. 3C. The protective layer 316 is preferably formed from a material which does not react chemically with gas or liquid containing fluorine halide.

Figure 3D:
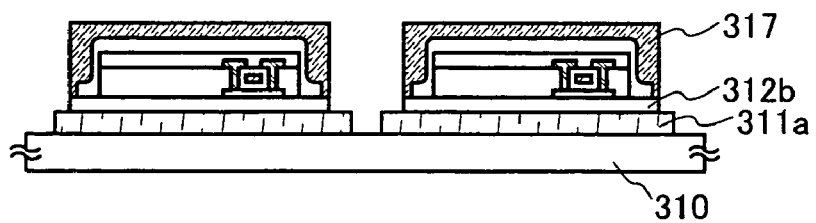

Then, a resist mask 317 is formed and the base insulating layer 312b is partially removed by etching and the peeling layer 311a is partially exposed (refer to FIG. 3D). The base insulating layer may be etched using the protective layer as a mask in a self-aligning manner to shorten the step.

Figure 3E:
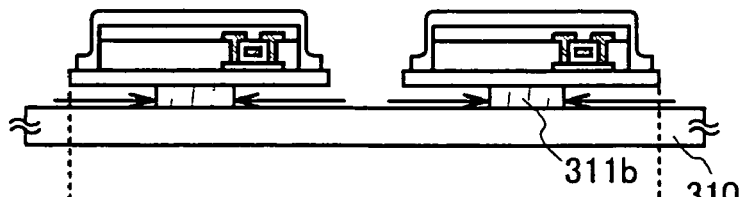
Figure 3F:
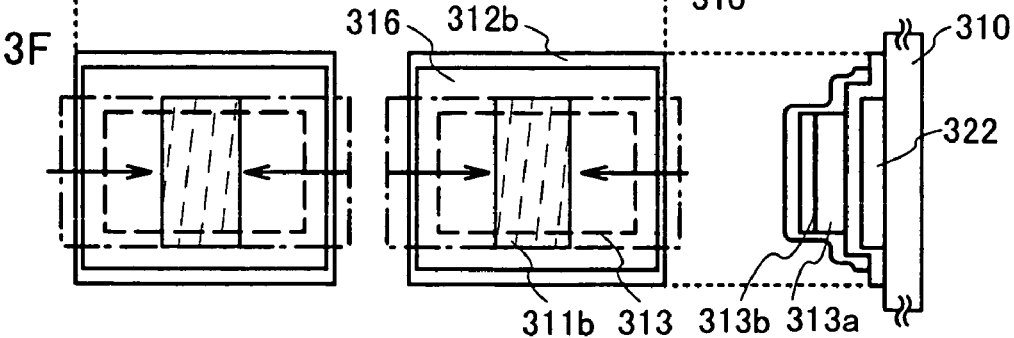

The peeling layer is removed using an etching agent. FIG. 3E shows a cross-sectional view in etching. As illustrated in FIG. 3E, the peeling layer is etched from the exposed two sides toward the center of the peeling layer. FIG. 3F shows a top view at this stage. FIG. 3G shows a cross-sectional view taken in a different section from FIG. 3E. Gas or liquid containing fluorine halide is used for the etching agent. As the gas containing fluorine halide, for example, chlorine trifluoride ($ClF_3$) is used. When the etching is completed, the remaining peeling layer 311b is completely removed to form a space 322.

After the etching, three sides of a peeled layer are fixed by a base insulating layer in Embodiment Mode 1; however, two sides of the peeled layer are fixed by the base insulating layer in this embodiment mode. The peeled layer 313 including the first element group is restrained from warping and the generation of a crack can be prevented by fixing by the base insulating layer 312b even though the etching of the peeling layer proceeds.

The rest of the steps are the same as in Embodiment Mode 1; therefore, detailed explanation is omitted here. In the similar way as in Embodiment Mode 1, the peeled layer including the first element group and the peeled layer including the second element group are thermocompressed to a first laminate film by a lamination method to peel the peeled layer including the first element group and the peeled layer including the second element group from the substrate 310 having the insulating surface. Then, in the similar way as in Embodiment Mode 1, sealing is carried out by thermocompressing (at approximately 100° C.) the peeled layer including the first element group and the peeled layer including the second element group to a second laminate film by a lamination method. Lastly, the thermocompressed layers are divided into the individual pieces to complete a device.

In this embodiment mode, etching is performed from two directions; therefore, the period of removing the whole peeling layer can be cut in half compared with Embodiment Mode 1.

This embodiment mode can be freely combined with Embodiment Mode 1.

Embodiment Mode 3

Here, a manufacturing method which is different from those in Embodiment Mode 1 and Embodiment Mode 2 is explained with reference to FIGS. 4A to 5B.

Embodiment Mode 1 illustrates an example in which a peeling layer is formed in an island shape; however, this embodiment mode illustrates an example without patterning a peeling layer.

First, a peeling layer 411a is formed over the whole surface of a substrate 410 having an insulating surface. Then, a base insulating layer 412a including an inorganic insulating film is formed (refer to FIG. 4A).

A peeled layer 413 including a first element group and the base insulating layer 412a as the first layer is formed. The peeled layer 413 including the first element group includes a first interlayer insulating layer 413a, a second interlayer insulating layer 413b, a plurality of TFTs 413c, and a conductive layer serving as an antenna. The peeled layer 413 including the first element group ends up being one device.

Then, a protective layer 416 is formed by a screen printing method or a droplet discharge method. Here, the protective layer 416 is formed so as to cover both of the peeled layer including the first element group and a peeled layer including a second element group (refer to FIG. 4B).

Embodiment Mode 1 and Embodiment Mode 2 illustrate an example of controlling etching by patterning the peeled layer; however, this embodiment mode illustrates an example in which the arrangement of the protective layer and the arrangement of the peeled layer are appropriately designed so as not to be overlapped with a portion which is expected to generate a crack.

Figure 4A:
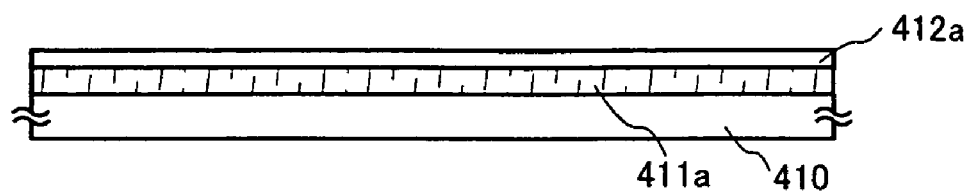
FIGS. 4A to 4D are explanatory cross-sectional views of a method for manufacturing a thin film integrated circuit according to the invention.
Figure 4B:
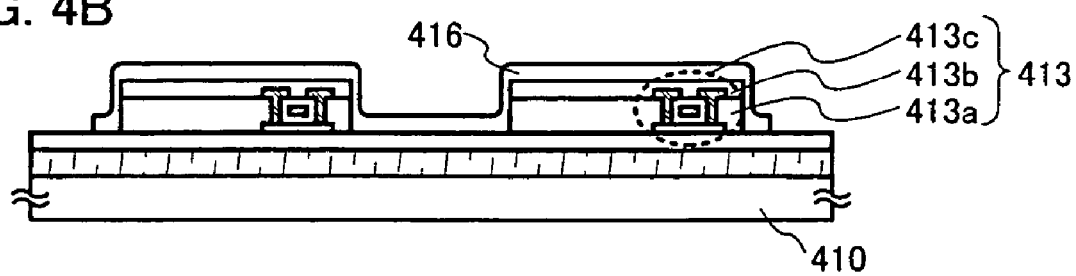
Figure 4C:
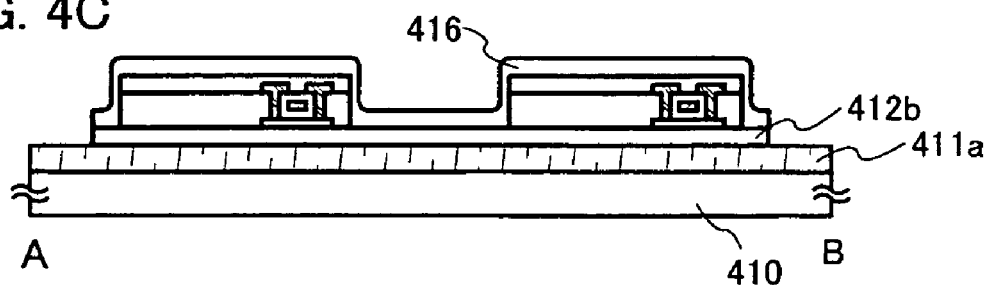

The base insulating layer 412a is selectively etched using the protective layer 416 as a mask to expose the peeling layer 411a (refer to FIG. 4C).

Figure 5A:
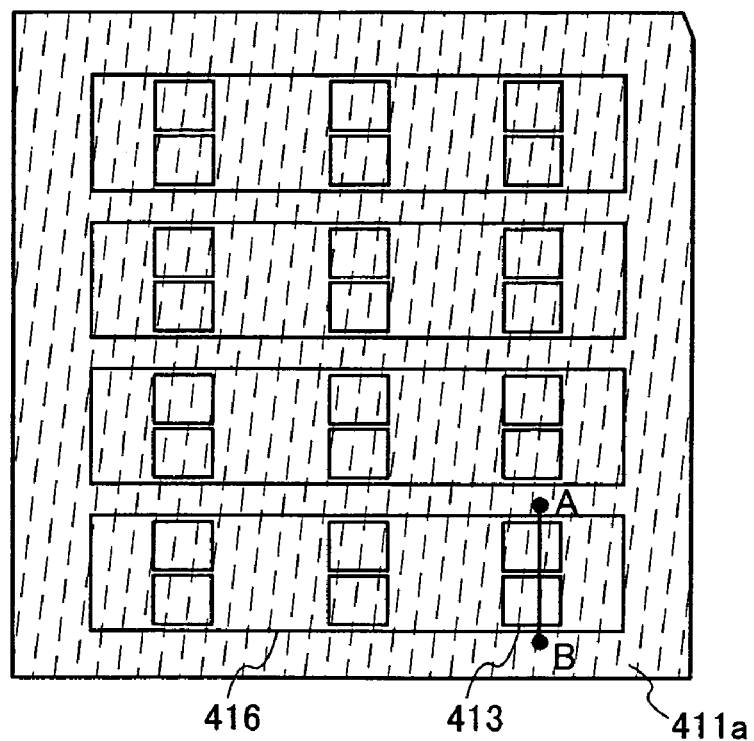
FIGS. 5A and 5B are explanatory top views of a method for manufacturing a thin film integrated circuit according to the invention.

FIG. 5A shows a top view at this stage. A cross-sectional view taken along a solid line A-B in FIG. 5A corresponds to FIG. 4C.

Figure 4D:
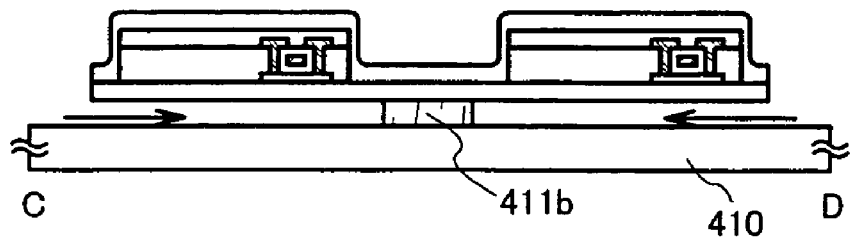

Then, the peeling layer is removed using an etching agent. As for the etching here, the peeling layer is not removed wholly but also made to remain partly by stopping the etching in midstream to fix the peeled layer by the remaining portion thereof. FIG. 4D shows a cross-sectional view after the etching. A peeled layer and thin film integrated circuits (the first element group) are arranged so that the etching proceeds to one direction.

Figure 5B:
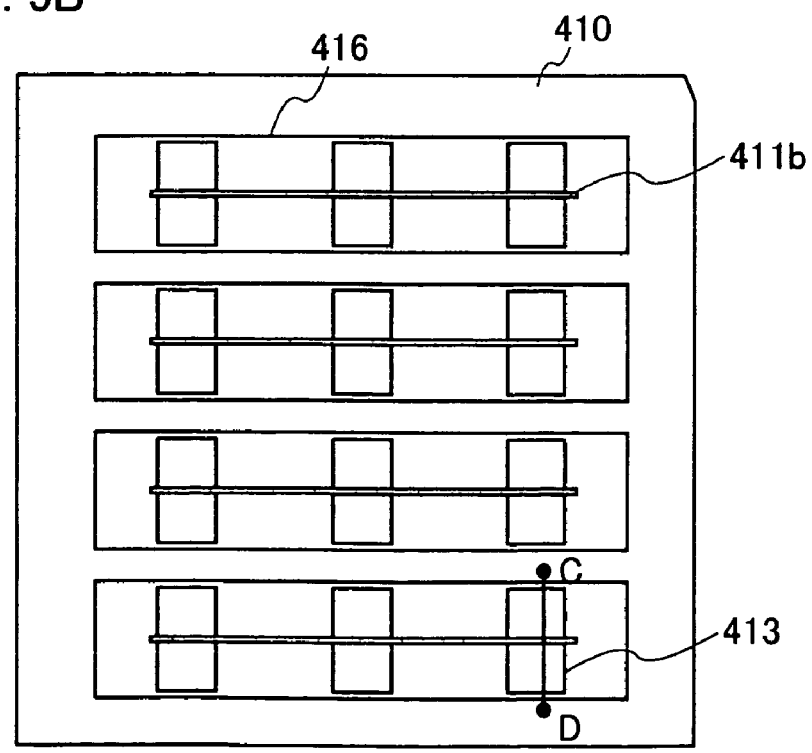

FIG. 5B shows a top view at this stage. A cross-sectional view taken along a solid line C-D in FIG. 5B corresponds to FIG. 4D.

After etching, a peeled layer is fixed by a base insulating layer in Embodiment Mode 1 and Embodiment Mode 2; however, the peeled layer 413 including the first element group is fixed by the remaining peeling layer 411b in this embodiment mode. The peeled layer 413 including the first element group is not arranged in a portion in which a crack is easy to generate; therefore, a crack is difficult to generate even though the etching of the peeling layer proceeds.

The rest of the steps are the same as in Embodiment Mode 1; therefore, detailed explanation is omitted here. In the similar way as in Embodiment Mode 1, the peeled layer including the first element group and the peeled layer including the second element group are thermocompressed to a first laminate film by a lamination method to peel the peeled layer including the first element group and the peeled layer including the second element group from the substrate 410 having the insulating surface. Then, in the similar way as in Embodiment Mode 1, sealing is carried out by thermocompressing (at approximately 100° C.) the peeled layer including the first element group and the peeled layer including the second element group to a second laminate film by a lamination method. Lastly, the thermocompressed layers are divided into the individual pieces to complete a device.

In this embodiment mode, a step of patterning a peeling layer is not required; therefore, the number of steps can be shortened compared with Embodiment Mode 1 and Embodiment Mode 2.

This embodiment mode can be freely combined with Embodiment Mode 1 or Embodiment Mode 2.

Embodiment Mode 4

An example of manufacturing equipment of a thin film integrated circuit is described in this embodiment.

FIGS. 6A to 6E illustrate a delivery carrier 1401, a first substrate carrying arm 1400, an etching agent introducing chamber 1405, an etching agent inlet 1406, an etching agent outlet 1407, a second substrate carrying arm 1408, a belt conveyor 1410, a film delivery roll 1411, a take-up roll 1412, a film delivery roll 1413, and an alignment device 1414.

Figure 6C:
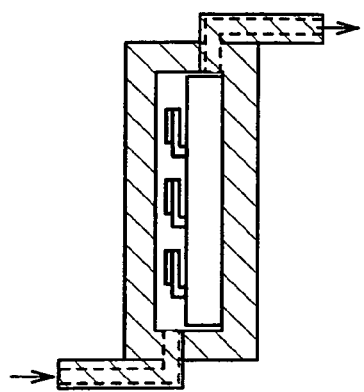
FIGS. 6A to 6E are views showing manufacturing equipment of a thin film integrated circuit.
Figure 6D:
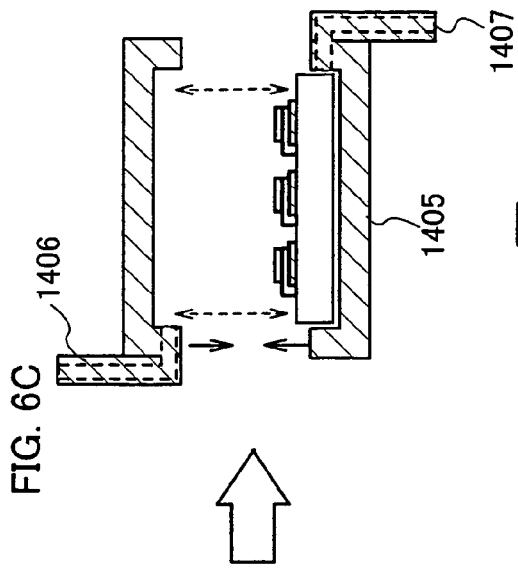
Figures 6A, 6B:
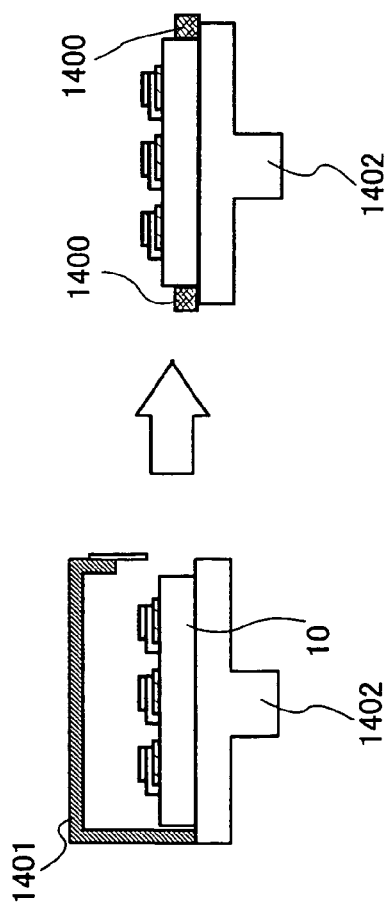

As illustrated in FIG. 6A, a layer including a thin film integrated circuit before removing a peeling layer is transported by using a delivery elevator 1402 from the delivery carrier 1401. At this time, the layer including the thin film integrated circuits can be fixed to a base insulating layer, and a substrate can be moved without the thin film integrated circuits being scattered. In the substrate 10 having an insulating surface at this stage, the peeling layer is partly exposed, which corresponds to a state shown in FIG. 2A in Embodiment Mode 1.

As illustrated in FIG. 6B, a substrate 10 having an insulating surface provided with the layer including the thin film integrated circuit is held between the first substrate carrying arms 1400 to be lifted, and placed in the etching agent introducing chamber 1405 shown in FIG. 6C. Alternatively, the thin film integrated circuit formed over the substrate 10 can be scooped up and put in the lower part of the etching agent introducing chamber 1405. That is, as long as a means that can place the substrate 10 having the insulating surface in the etching agent introducing chamber 1405 is used, it is not limited to the first substrate carrying arms 1400.

In this state, an etching agent is introduced from the etching agent inlet 1406 and exhausted from the etching agent outlet 1407. The etching agent removes the peeling layer from the exposed portion thereof, that is, removes the peeling layer existing between the thin film integrated circuit and the substrate to form a space below the thin film integrated circuit.

Figure 6E:
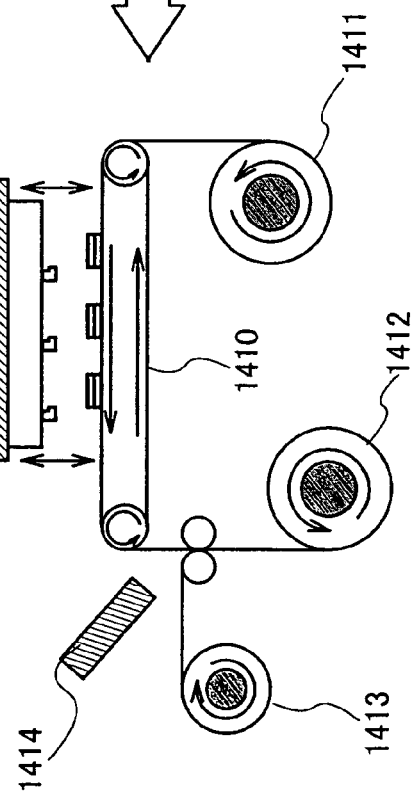

After removing the peeling layer, the substrate is moved to a device shown in FIG. 6E by the second substrate carrying arm 1408. The layer including the thin film integrated circuits can be fixed by the base insulating layer and the substrate can be moved without the thin film integrated circuits being scattered.

Thereafter, only the thin film integrated circuit is transferred by pressing the substrate against an extremely thin film pasted with a film having an adhesion surface such as a Scotch tape, a Tackwell tape (extremely thin single-faced tape), a Double Tack tape (extremely thin double-faced tape) that is delivered from the film delivery roll 1411. In that case, the film having the adhesion surface is made to have higher adhesion strength than the adhesion strength between the base insulating layer and the substrate. Simultaneously, the thin film integrated circuits are divided into individual pieces. FIG. 6E illustrates a state after transferring the thin film integrated circuits, in which a part of the base insulating layer being in contact with the substrate is not transferred to remain over the substrate.

An antenna may be provided for the film having an adhesion surface. In the case where the distance between the antennas and the distance between the thin film integrated circuits are different from each other, the antenna may be provided over an extensible film, and the antennas and the thin film integrated circuits may be pasted with each other while pulling the extensible film.

Thereafter, a film serving as a protective film, for example, a film for laminating, a Scotch tape, a Tackwell tape (extremely thin single-faced tape), a Double Tack tape (extremely thin double-faced tape), each of which is bonded to an extremely thin film, is delivered from the film delivery roll 1413. These films have preferably resistance to an etching gas and high heat resistance. The alignment of bonding is controlled by the alignment device 1414, for example, a CCD camera, and the protective film is bonded to the thin film integrated circuits.

Lastly, the completed thin film integrated circuit is taken up by the take-up roll 1412.

Thereafter, the thin film integrated circuits are divided when each of the thin film integrated circuits is mounted on a good. Accordingly, the thin film integrated circuits can be moved or traded in the state of being taken up by the take-up roll 1412. As a result, extremely fine thin film integrated circuits each of which is 5 mm square (25 mm$^2$) or less, preferably, 0.3 mm square (0.09 mm$^2$) to 4 mm square (16 mm$^2$) can be readily manufactured, moved, or traded without being scattered.

This embodiment can be freely combined with Embodiment Mode 1, Embodiment Mode 2, or Embodiment Mode 3.

Embodiment Mode 5

In this embodiment, manufacturing equipment which is different from that described in Embodiment Mode 4 is described. Embodiment Mode 4 illustrates an example of pressing a substrate with a second substrate carrying arm, whereas this embodiment mode illustrates an example of using a roll.

Figure 7:
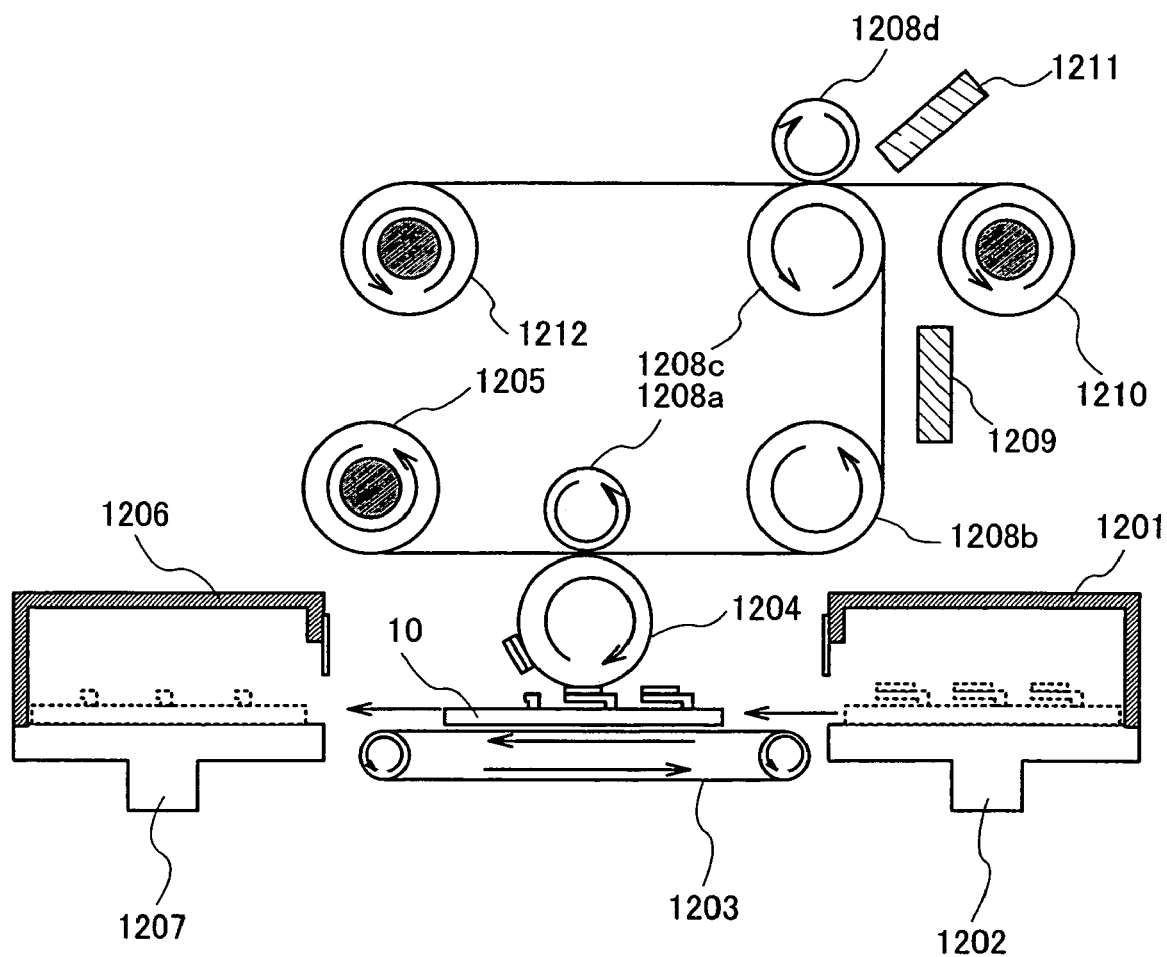
FIG. 7 is a view showing manufacturing equipment of a thin film integrated circuit.

FIG. 7 illustrates a delivery carrier 1201, a delivery elevator 1202, a belt conveyor 1203, a transfer roller 1204, a film delivery roll 1205, a discharge carrier 1206, a discharge elevator 1207, rollers 1208a, 1208b, 1208c, and 1208d, an operation evaluation device 1209, a film delivery roll 1210, an alignment device 1211, and a take-up roll 1212. An object having an adhesion surface, that is, a so-called tape, is delivered from the film delivery roll 1205 for upper surfaces of the thin film integrated circuits.

As illustrated in FIG. 7, a substrate 10 provided with thin film integrated circuits is transported from the delivery carrier 1201 to be placed over the belt conveyor 1203. As for the substrate 10 at this stage, a peeling layer is removed, which corresponds to a state shown in FIG. 2A in Embodiment Mode 1.

The substrate transported by the belt conveyor 1203 is pressed against the transfer roller 1204 having an adhesion surface to transfer only the thin film integrated circuits formed over a base insulating layer. The transfer roller 1204 can be formed by silicon-based resin or fluoride-based resin. Specifically, silicon rubber, perfluoroelastomer, Fluon Aflas, Teflon (registered trademark) rubber, and the like can be used. Especially, the perfluoroelastomer and the Fluon Aflas have high heat resistance and high chemical resistance, and so they are preferably used.

The transfer roller 1204 is made to have higher adhesion strength than that between the substrate and the base insulating layer. Then, only the thin film integrated circuits over the base insulating layer is transferred from the substrate, and the substrate 10 is moved by the belt conveyor 1203.

Thereafter, a film having an adhesion surface, for example, a Scotch tape, a Tackwell tape (extremely thin single-faced tape), a Double Tack tape (extremely thin double-faced tape), each of which is bonded to an extremely thin film, or the like is delivered from the film delivery roll 1205. These films desirably have resistance to an etching gas and high heat resistance. Then, the film having the adhesion surface can be bonded to the transferred thin film integrated circuits by the roller 1208a.

An antenna may be provided for the film provided with the adhesion surface. In this instance, an alignment device is preferably provided in the vicinity of the roller 1208a. In the case that the distance between the antennas and the distance between the thin film integrated circuits are different from each other, the antenna may be provided over an extensible film, and the antennas and the thin film integrated circuits can be pasted with each other while pulling the extensible film.

The thin film integrated circuits pasted with the film passes through the operation evaluation device 1209 by the roller 1208b or the like. At this moment, the operation of the thin film integrated circuits can be confirmed. For instance, when the thin film integrated circuit mounted with the antenna is transported, a predetermined signal is recorded using a reader/writer as the operation evaluation device, and the operation can be confirmed from the fact whether the thin film integrated circuit returns the signal or not.

Since approximately 672000 pieces of ID tags of 1 mm square can be manufactured in the case of manufacturing the thin film integrated circuits using a glass substrate of 7300 mm×9200 mm, for example, the confirmation of operation is carried out for randomly selected thin film integrated circuits.

Thereafter, a film serving as a protective film (protective film), for example, a film for laminating, a Scotch tape, a Tackwell tape (extremely thin single-faced tape), a Double Tack tape (extremely thin double-faced tape), each of which is bonded to an extremely thin film, or the like is delivered from the film delivery roll 1210. These protective films desirably have resistance to an etching gas and high heat resistance. The alignment of bonding is controlled by the alignment device 1211, for example, a CCD camera, and the protective film is bonded to the thin film integrated circuit.

Lastly, the completed thin film integrated circuits are taken up by the take-up roll 1212.

Thereafter, the thin film integrated circuits are divided into individual pieces when it is mounted on a good. Accordingly, the thin film integrated circuits can be transported or traded in the state of being taken up by the take-up roll 1212. As a result, extremely fine thin film integrated circuits of 5 mm square (25 mm$^2$) or less, preferably, 0.3 mm square (0.09 mm$^2$) to 4 mm square (16 mm$^2$) can be readily manufactured, transported, or traded without being scattered.

This embodiment can be freely combined to any one of Embodiments 1 to 4.

Embodiment Mode 6

A thin film integrated circuit manufactured according to the present invention has a plurality of elements and a conductive layer serving as an antenna. The plurality of elements corresponds to a thin film transistor, a capacitor element, a resistance element, a diode, and the like.

Figure 8:
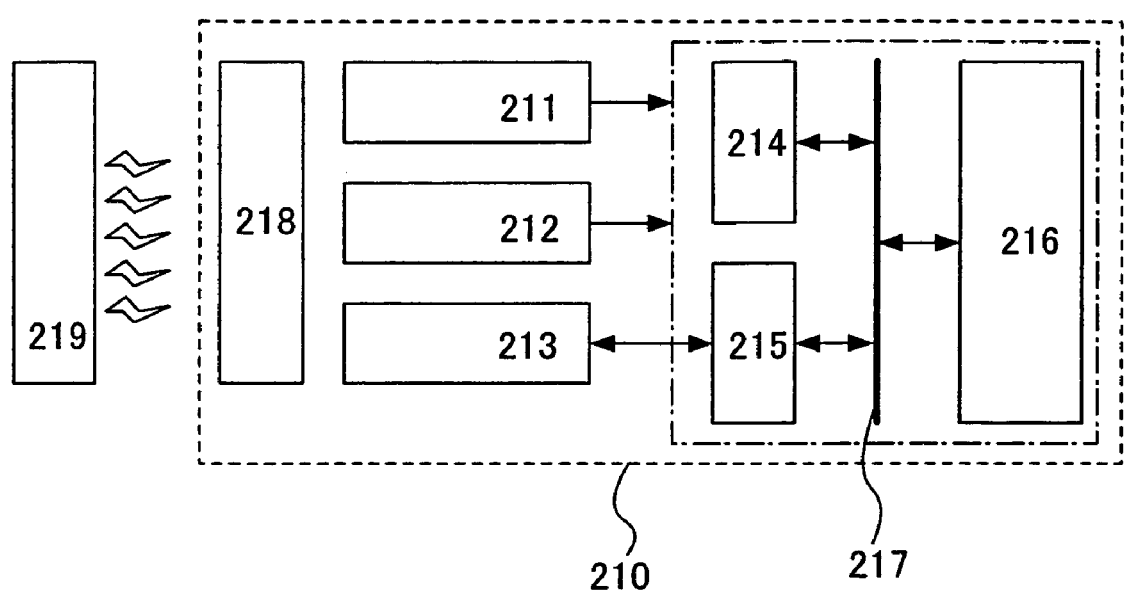
FIG. 8 is an explanatory view of a thin film integrated circuit.

A thin film integrated circuit 210 has a function of communicating data wirelessly. A plurality of elements included in the thin film integrated circuit 210 configures various circuits, for example, a power source circuit 211, a clock generation circuit 212, a data demodulation/modulation circuit 213, a control circuit 214, an interface circuit 215, a memory 216, a data bus 217, antenna (also referred to as antenna coil) 218, and the like (refer to FIG. 8).

The power source circuit 211 is a circuit which generates various power sources to be supplied to the foregoing each circuit based on an alternating current signal inputted from the antenna 218. The clock generation circuit 212 is a circuit which generates various clocks to be supplied to the foregoing each circuit based on the alternating current signal inputted from the antenna 218. The data demodulation/modulation circuit 213 has a function of demodulating/modulating data for communicating with a reader/writer 219. The control circuit 214 is equivalent to a central processing unit (CPU), a microprocessor unit (MPU), or the like, and has a function of controlling other circuits. The antenna 218 has a function of transmitting and receiving an electromagnetic field or an electric wave. The reader/writer 219 performs communication with the thin film integrated circuit, controls the communication, and controls the processing relating to communication data.

The circuits including the thin film integrated circuits are not limited to the foregoing configurations, for example, the circuits may have a configuration added with another component part such as a limiter circuit of power source voltage or hardware for encryption processing use.

This embodiment can be freely combined with any one of Embodiments 1 to 5.

Embodiment Mode 7

The usage of a thin film integrated circuit manufactured according to the present invention is wide-ranging. For example, the thin film integrated circuit can be used by providing for paper money, coins, securities, bearer bonds, certificates (driver's license, residence certificate, and the like appearing in FIG. 9A), packing containers (wrapping paper, a bottle, and the like appearing in FIG. 9B), a recording medium (DVD software, a video tape, and the like appearing in FIG. 9C), vehicles (a bicycle, and the like appearing in FIG. 9D), commodities (a bag, glasses, and the like appearing in FIG. 9E), foods, garments, livingware, electronic appliances, and the like. The electronic appliances represent a liquid crystal display device, an EL display device, a television device (also referred to as TV, TV receiver, or television receiver), a cellular phone, and the like.

Since the thin film integrated circuit can be reduced its thickness drastically according to the invention, it is advantageous that a photograph for the certificates (driver's license, residence certificate, and the like appearing in FIG. 9A) can be stacked over a thin film integrated circuit 210.

The thin film integrated circuit is fixed to goods by pasting over the surface of the goods or embedding in the goods. For example, the thin film integrated circuit is embedded in a paper of a book, or in a package formed from an organic resin. A counterfeit can be prevented by providing the thin film integrated circuit for the paper money, the coins, the securities, the bearer bonds, the certificates, and the like. The efficiency in an inspection system or a system used in a rental shop can be promoted by providing the thin film integrated circuit for the packing containers, the recording medium, the commodities, the foods, the garment, the livingware, the electronic appliances, and the like. A counterfeit or theft can be prevented by providing the thin film integrated circuit for the vehicles.

Figure 10A:
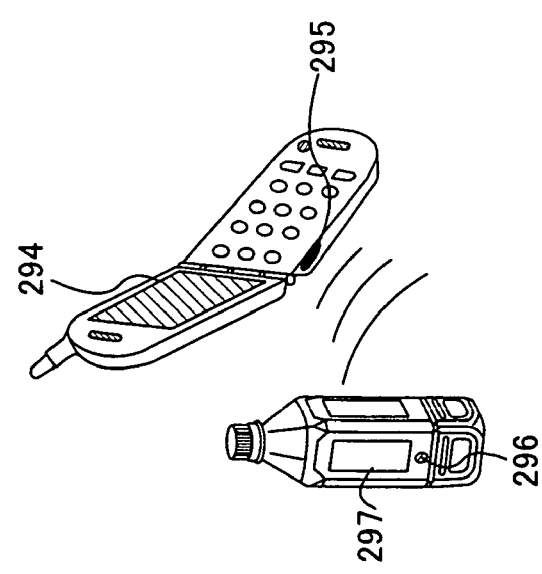
FIGS. 10A and 10B are explanatory views of a usage pattern of a thin film integrated circuit.
Figure 10B:
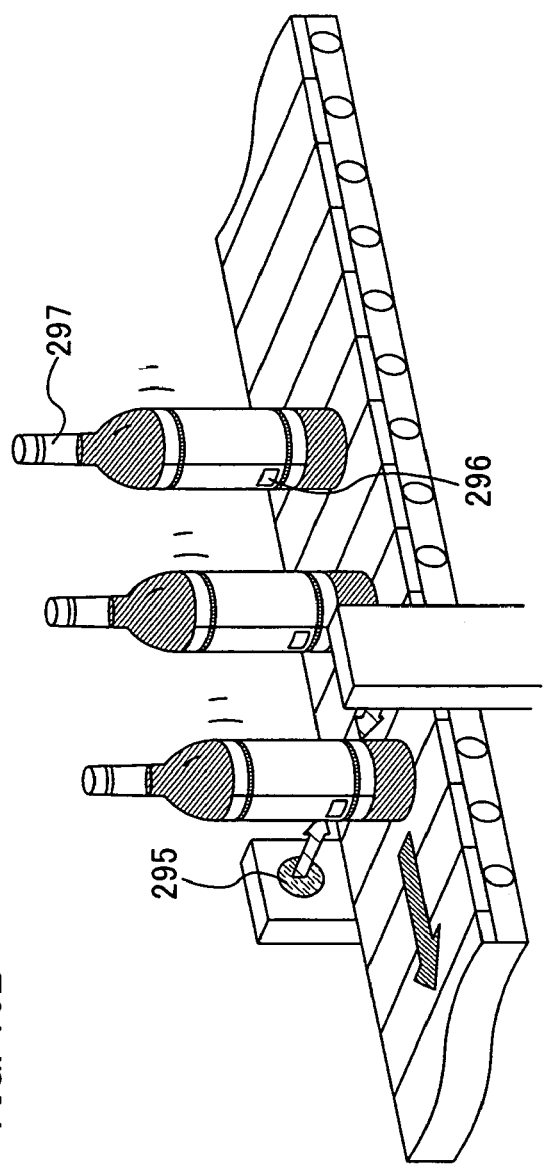
Figure 11A:
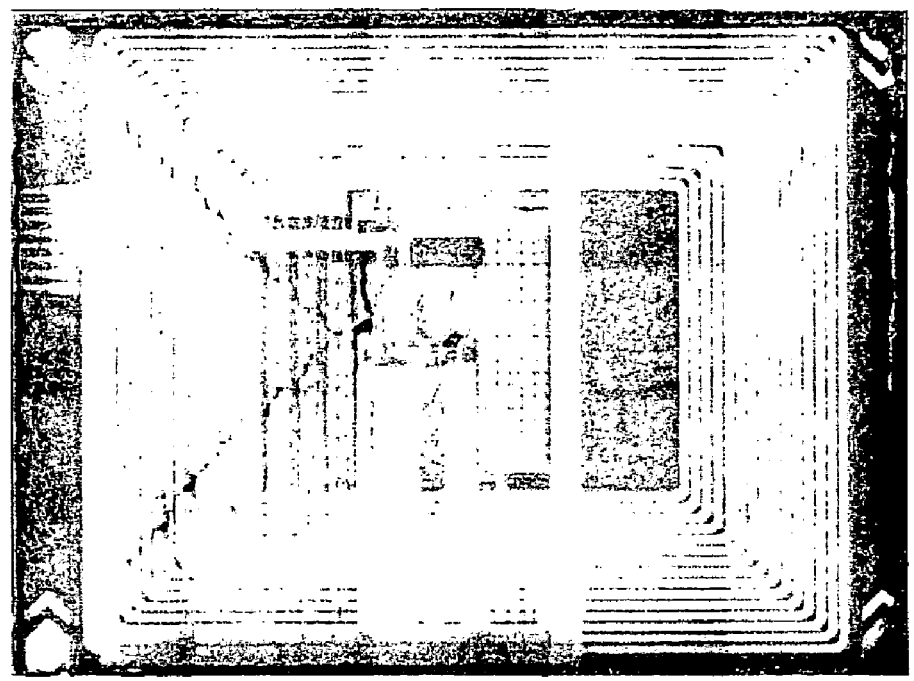
FIGS. 11A and 11B are a photograph showing an integrated circuit having a crack and a view showing the position of the crack.
Figure 11B:
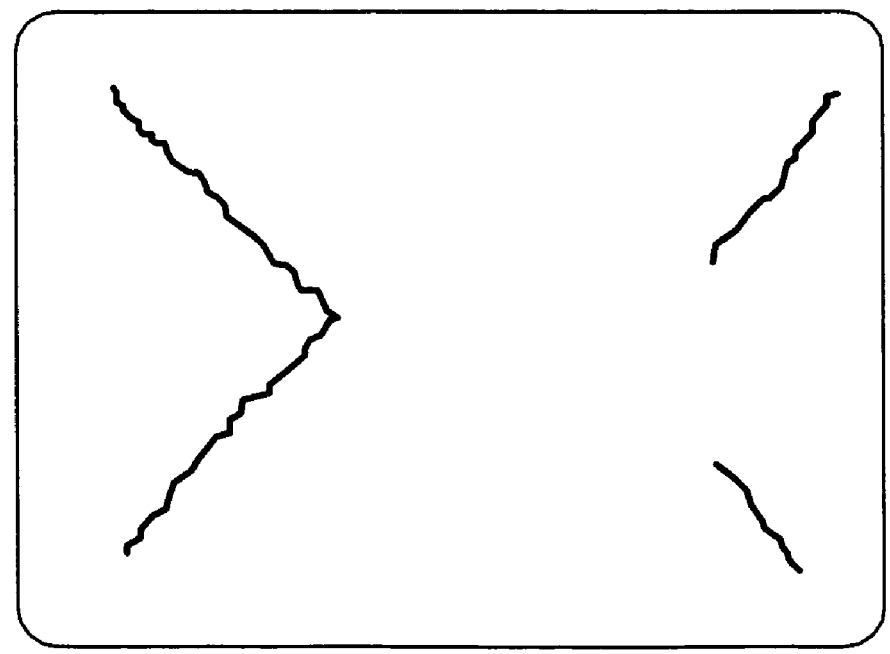

By applying the thin film integrated circuit for a system for logistics or distribution, the system becomes increasingly sophisticated. For example, there is the case that a reader/writer 295 is provided for the side face of a portable terminal having a display portion 294 and a thin film integrated circuit 296 is provided for the side face of a product 297 (refer to FIG. 10A). In that case, information on the raw material, the place of origin, the history of distribution cource, and the like of the product 297 can be displayed on the display portion 294 when the reader/writer 295 is held over the thin film integrated circuit 296. Alternatively, there is the case that the reader/writer 295 is provided to the side of a belt conveyor (refer to FIG. 10B). In that case, inspection of the product 297 can be carried out easily.

This embodiment can be freely combined with any one of Embodiments 1 to 6.

According to the invention, a matrix type (multiple patterned type) manufacturing method that small multiple mounted over a glass substrate having the size of 600 mm×720 mm, 680 mm×880 mm, 1000 mm×1200 mm, 1100 mm×1250 mm, 1150 mm×1300 mm, or more and the electronic component elements are divided into individual pieces as a product can be realized.

This application is based on Japanese Patent Application serial No. 2004-273426 field in Japan Patent Office on Sep. 21, 2004, the contents of which are hereby incorporated by reference.

What is claimed is:

1. A method for manufacturing a semiconductor device comprising:
    forming a peeling layer over a first substrate, with a top shape of the peeling layer including at least three sides;
    forming a base insulating layer over the peeling layer and the first substrate, the base insulating layer covering all of the at least three sides of the peeling layer;
    forming at least one thin film integrated circuit over the peeling layer with the base insulating layer interposed therebetween;
    forming a protective layer covering the thin film integrated circuit;
    exposing one of the sides of the peeling layer by removing the base insulating layer selectively, while leaving the other sides of the peeling layer covered by the base insulating layer;
    etching the peeling layer; and
    transferring the thin film integrated circuit to a second substrate,
    wherein the etching proceeds in one direction from the exposed side of peeling layer, and
    wherein an adhesive material is provided on the second substrate.

2. A method for manufacturing a semiconductor device according to claim 1, wherein a top surface of the thin film integrated circuit is a rectangular shape and the exposed side of the peeling layer is located in parallel to one side or two opposing sides of the thin film integrated circuit.

3. A method for manufacturing a semiconductor device according to claim 1, wherein the base insulating layer comprises a material which does not react chemically with gas or liquid containing fluorine halide.

4. A method for manufacturing a semiconductor device according to claim 1, wherein the protective layer is comprises a material which does not react chemically with gas or liquid containing fluorine halide.

5. A method for manufacturing a semiconductor device comprising:
    forming a peeling layer over a first substrate, with the a top shape of the peeling layer including at least three sides;
    forming a base insulating layer over the peeling layer and the first substrate, the base insulating layer covering all of the at least three sides of the peeling layer;
    forming at least one thin film integrated circuit over the peeling layer with the base insulating layer interposed therebetween;
    forming a protective layer covering the thin film integrated circuit;
    exposing a first side and a second side of the peeling layer by removing the base insulating layer selectively, while leaving other of the at least three sides of the peeling layer covered by the base insulating layer;
    etching the peeling layers; and
    transferring the thin film integrated circuit to a second substrate,
    wherein the first side and the second side of the peeling layer are opposed to each other, wherein the etching proceeds in one direction from the first side and the second side of the peeling layer, and wherein an adhesive material is provided on the second substrate.

6. A method for manufacturing a semiconductor device according to claim 5, wherein a top surface of the thin film integrated circuit is a rectangular shape and the exposed first side of the peeling layer is located in parallel to one side or two opposing sides of the thin film integrated circuit.

7. A method for manufacturing a semiconductor device according to claim 5, wherein the base insulating layer comprises a material which does not react chemically with gas or liquid containing fluorine halide.

8. A method for manufacturing a semiconductor device according to claim 5, wherein the protective layer is comprises a material which does not react chemically with gas or liquid containing fluorine halide.

9. A method for manufacturing a semiconductor device comprising:

forming a peeling layer over a first substrate;

forming at least a first peeling layer and a second peeling layer by removing the peeling layer selectively, with a top shape of each of the first peeling layer and the second peeling layer including at least three sides;

forming a base insulating layer over the first peeling layer, the second peeling layer and the first substrate, with the base insulating layer covering all of the sides of the first peeling layer and the second peeling layer;

forming a first thin film integrated circuit over the first peeling layer with the base insulating layer interposed therebetween and a second thin film integrated circuit over the second peeling layer with the base insulating layer interposed therebetween;

forming a first protective layer covering the first thin film integrated circuit and a second protective layer covering the second thin film integrated circuit;

exposing one of the sides of the first peeling layer and one of the sides of the second peeling layer by removing the base insulating layer selectively, while leaving the other sides of the first peeling layer and the other sides of the second peeling layer covered by the base insulating layer;

etching the first and second peeling layers; and transferring the first and second thin film integrated circuits to a second substrate, wherein the side of the second peeling layer that is exposed is between the first and second thin film integrated circuits, wherein the etching proceeds in one direction from the exposed side of the first peeling layer and the exposed side of the second peeling layer, and wherein an adhesive material is provided on the second substrate.

10. A method for manufacturing a semiconductor device according to claim 9, wherein the method further comprises dividing the first and second thin film integrated circuits into the individual pieces after the transferring step.

11. A method for manufacturing a semiconductor device according to claim 9, wherein each top surface of the first and second thin film integrated circuits is a rectangular shape and each of the exposed sides of the first peeling layer and the second peeling layer is located in parallel to one side or two opposing sides of one of the thin film integrated circuits.

12. A method for manufacturing a semiconductor device according to claim 9, wherein the base insulating layer comprises a material which does not react chemically with gas or liquid containing fluorine halide.

13. A method for manufacturing a semiconductor device according to claim 9, wherein the protective layer is comprises a material which does not react chemically with gas or liquid containing fluorine halide.

14. A method for manufacturing a semiconductor device comprising:

forming a peeling layer over a first substrate;

forming at least a first peeling layer and a second peeling layer by removing the peeling layer selectively, with a top shape of each of the first peeling layer and the second peeling layer including at least three sides;

forming a base insulating layer over the first peeling layer, the second peeling layer and the first substrate, with the base insulating layer covering all of the sides of the first peeling layer and the second peeling layer;

forming a first thin film integrated circuit over the first peeling layer with the base insulating layer interposed therebetween and a second thin film integrated circuit over the second peeling layer with the base insulating layer interposed therebetween;

forming a first protective layer covering the first thin film integrated circuit and a second protective layer covering the second thin film integrated circuit;

exposing one of the sides of the first peeling layer and one of the sides of the second peeling layer by removing the base insulating layer selectively, while leaving the other sides of the first peeling layer and the other sides of the second peeling layer covered by the base insulating layer;

etching the first and second peeling layers; and interposing the first and second thin film integrated circuits between a first film and a second film by thermo-compressing, wherein the side of the second peeling layer that is exposed is between the first thin film integrated circuit and the second thin film integrated circuit, wherein the etching proceeds in one direction from the exposed side of the first peeling layer and the exposed side of the second peeling layer, and wherein an adhesive material is provided on the second substrate.

15. A method for manufacturing a semiconductor device according to claim 14, the method further comprises dividing the first and second thin film integrated circuits into the individual pieces after the interposing step.

16. A method for manufacturing a semiconductor device according to claim 14, wherein each top surface of the first and second thin film integrated circuits is a rectangular shape and each of the exposed sides of the first peeling layer and the second peeling layer is located in parallel to one side or two opposing sides of one of the thin film integrated circuits.

17. A method for manufacturing a semiconductor device according to claim 14, wherein the base insulating layer comprises a material which does not react chemically with gas or liquid containing fluorine halide.

18. A method for manufacturing a semiconductor device according to claim 14, wherein the protective layer is comprises a material which does not react chemically with gas or liquid containing fluorine halide.

19. A method for manufacturing a semiconductor device comprising:

forming a peeling layer over a first substrate, with a top shape of the peeling layer including at least three sides;

forming a base insulating layer over the peeling layer, the base insulating layer covering all of the at least three sides of the peeling layer;

forming at least first and second thin film integrated circuits over the peeling layer;

forming a protective layer for covering the first and second thin film integrated circuits;

exposing a first side and a second side of the peeling layer by selectively removing the base insulating layer, while leaving other of the at least three sides of the peeling layer covered by the base insulating layer;

partially etching the peeling layer, so as to leave a part of the peeling layer between the first and second thin film integrated circuits; and transferring the first and second thin film integrated circuits to a second substrate, wherein an adhesive material is provided on the second substrate.

20. A method for manufacturing a semiconductor device according to claim 19, wherein the method further comprises dividing the first and second thin film integrated circuits into the individual pieces after the transferring step.

21. A method for manufacturing a semiconductor device according to claim 19, wherein the base insulating layer comprises a material which does not react chemically with gas or liquid containing fluorine halide.

22. A method for manufacturing a semiconductor device according to claim 19, wherein the protective layer is comprises a material which does not react chemically with gas or liquid containing fluorine halide.

23. A method for manufacturing a semiconductor device according to claim 19, wherein the first and second sides of the peeling layer are opposed to each other.

* * * * *